United States Patent
Baek et al.

(10) Patent No.: US 10,056,133 B2
(45) Date of Patent: Aug. 21, 2018

(54) SEMICONDUCTOR MEMORY DEVICE

(71) Applicant: KABUSHIKI KAISHA TOSHIBA, Tokyo (JP)

(72) Inventors: Guseul Baek, Ota Tokyo (JP); Toshikazu Fukuda, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/447,040

(22) Filed: Mar. 1, 2017

(65) Prior Publication Data

US 2018/0068709 A1 Mar. 8, 2018

(30) Foreign Application Priority Data

Sep. 6, 2016 (JP) .................. 2016-173984

(51) Int. Cl.
    *G11C 5/14* (2006.01)
    *G11C 11/417* (2006.01)
    *G11C 11/412* (2006.01)
    *G11C 11/419* (2006.01)

(52) U.S. Cl.
    CPC .............. *G11C 11/417* (2013.01); *G11C 5/14* (2013.01); *G11C 5/147* (2013.01); *G11C 11/412* (2013.01); *G11C 11/419* (2013.01)

(58) Field of Classification Search
    None
    See application file for complete search history.

(56) References Cited

U.S. PATENT DOCUMENTS

| | | | |
|---|---|---|---|
| 8,045,402 B2 | 10/2011 | Yeung | |
| 8,125,837 B2 | 2/2012 | Yamaoka et al. | |
| 8,750,056 B2* | 6/2014 | Kang | G11C 8/08 365/185.23 |
| 8,908,418 B2 | 12/2014 | Yabuuchi | |
| 9,324,392 B1* | 4/2016 | Asenov | G11C 7/12 |
| 9,697,877 B2* | 7/2017 | Shanbhag | G11C 7/12 |

FOREIGN PATENT DOCUMENTS

| | | |
|---|---|---|
| JP | 2011008909 A | 1/2011 |
| JP | 5197241 B2 | 5/2013 |
| JP | 5777991 B2 | 9/2015 |

OTHER PUBLICATIONS

U.S. Appl. No. 15/063,115, filed Mar. 7, 2016.

* cited by examiner

*Primary Examiner* — Son Mai
(74) *Attorney, Agent, or Firm* — Patterson & Sheridan, LLP

(57) ABSTRACT

A semiconductor memory device includes a cell array including memory cells. A potential generation circuit applies a first potential to the memory cells. A control signal output circuit outputs a control signal based on the first potential. A pulse width adjustment circuit adjusts a pulse width of a word line voltage of the cell array based on the control signal. An amplitude of a voltage applied to bit lines connected to the memory cells is controlled with the pulse width.

19 Claims, 8 Drawing Sheets

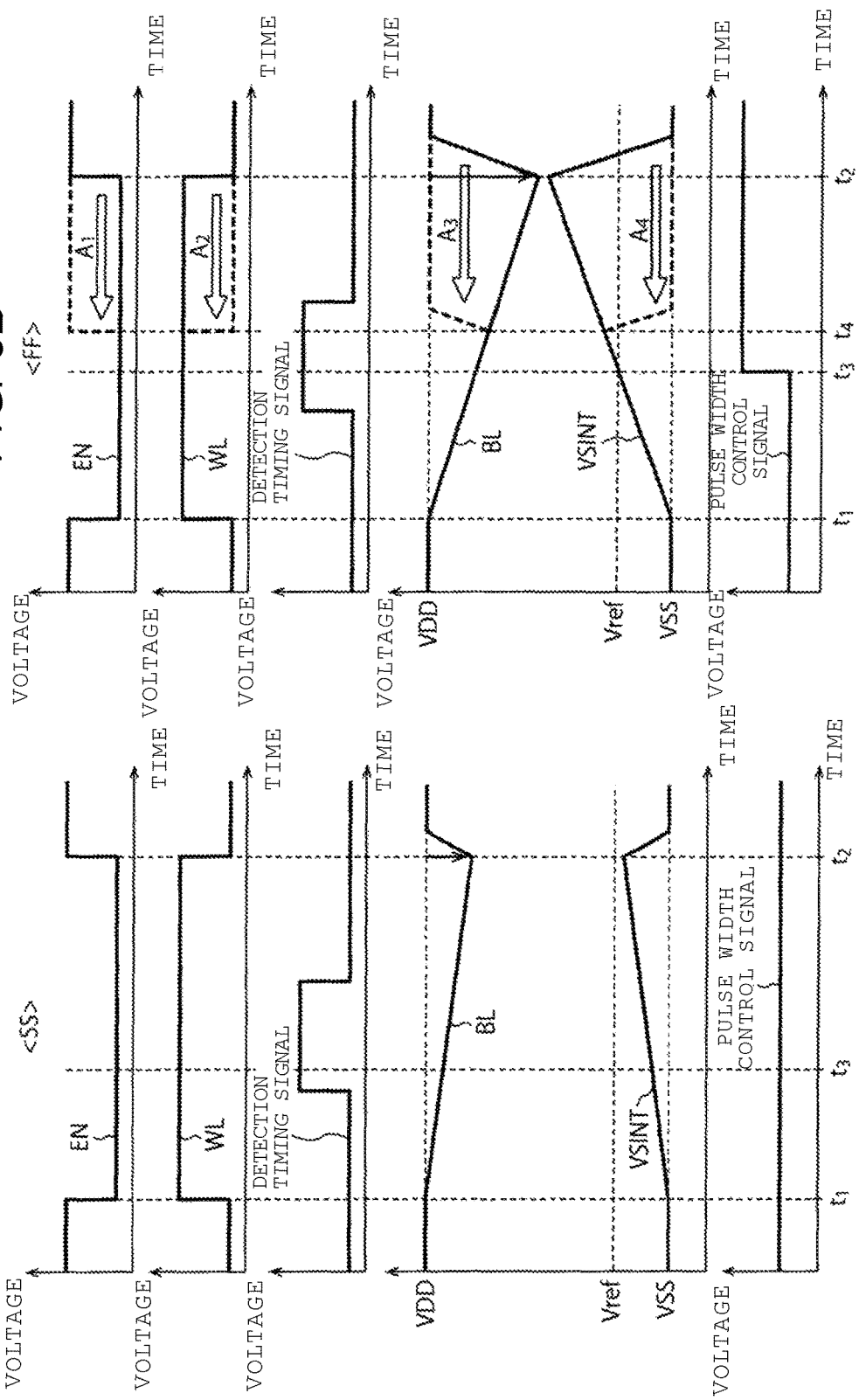

SEMICONDUCTOR MEMORY DEVICE

CROSS-REFERENCE TO RELATED APPLICATION

This application is based upon and claims the benefit of priority from Japanese Patent Application No. 2016-173984, filed Sep. 6, 2016, the entire contents of which are incorporated herein by reference.

FIELD

Embodiments described herein relate generally to a semiconductor memory device.

BACKGROUND

The power consumption in a static random access memory (SRAM) is highly dependent on the voltages applied to bit lines, such that as the amplitude of the voltages applied to the bit lines increases, power consumption increases. Hereinafter, this voltage amplitude is referred to as "BL amplitude." In general, BL amplitude of the voltages that can be used in operating a SRAM is known to be highly dependent on the particulars of the manufacturing process of the SRAM.

Due to this fabrication process dependency, the BL amplitude is set, in design, so as to enable readout of data under the worst condition (i.e., the minimally acceptable fabrication result) in which case the acceptable BL amplitude is small. However, since the BL amplitude is larger than the required minimum amplitude for SRAM that exceeds the minimally acceptable fabrication result (e.g., for the ideal or best condition) the power consumption of the SRAM would be excessive.

A timing adjustment method using a dummy cell has previously been proposed to reduce power consumption in such a situation. However, a difference in power consumption between an SS (slow-slow) process SRAM and an FF (fast-fast) process SRAM becomes a problem with this method. Here, "SS process" and "FF process" are terms related to the processing variation of the SRAM resulting from differences in fabrication.

The decreasing of a driving current for a metal-oxide-semiconductor field-effect transistor (MOSFET) is referred to as the "SS process", and the increasing of a driving current for a MOSFET is referred to as the "FF process" A difference in driving current between the SS process and the FF process SRAM occurs due to, for example, a variation of the threshold voltage of a MOSFET, which causes a variation in BL amplitude.

DESCRIPTION OF THE DRAWINGS

FIGS. 8A and 8B are waveform charts illustrating operations of the semiconductor memory device according to the second embodiment.

DETAILED DESCRIPTION

In general, according to one embodiment, a semiconductor memory device includes a cell array including memory cells, such as SRAM cells. A potential generation circuit is configured to apply a first potential to the memory cells. A control signal output circuit is configured to output a control signal based on the first potential. And a pulse width adjustment circuit is configured to adjust a pulse width of a word line voltage of the cell array based on the control signal. An amplitude of a voltage applied to bit lines connected to the memory cells is controlled with the pulse width.

Hereinafter, embodiments of the disclosure will be described with reference to the drawings.

First Embodiment

Figure 1:
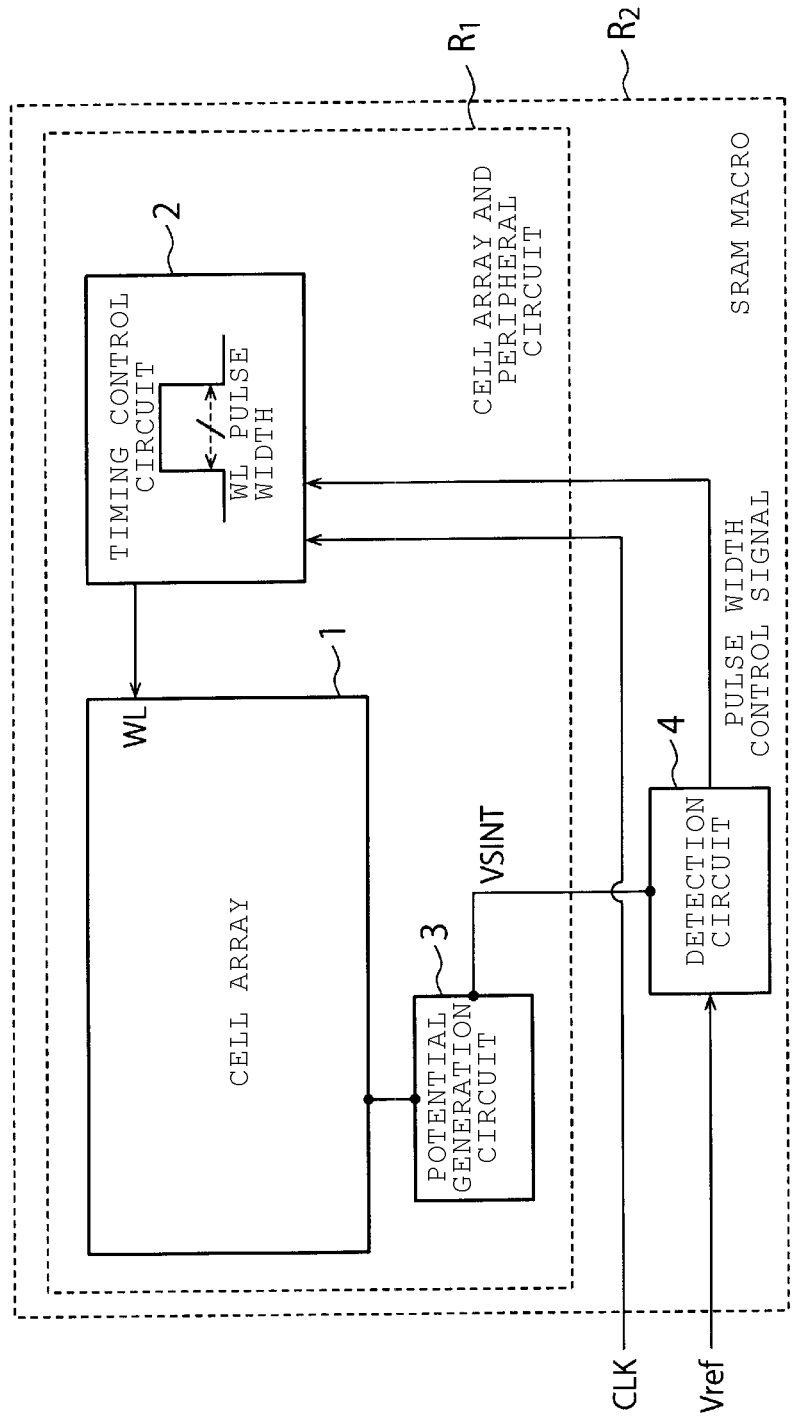
FIG. 1 is a schematic diagram illustrating a configuration of a semiconductor memory device according to a first embodiment.

FIG. 1 is a schematic diagram illustrating a configuration of a semiconductor memory device according to a first embodiment. FIG. 1 illustrates a semiconductor memory device including an SRAM.

The semiconductor memory device illustrated in FIG. 1 includes a cell array 1, a timing control circuit 2, a potential generation circuit 3, and a detection circuit 4. The timing control circuit 2 is an example of a pulse width adjustment circuit. The detection circuit 4 is an example of a control signal output circuit. Reference character $R_1$ denotes a region which corresponds to the position of the cell array 1 and a peripheral circuit. Reference character $R_2$ denotes a region which corresponds to an SRAM macro.

The cell array 1 includes a plurality of memory cells, a plurality of word lines connected to the memory cells, and a plurality of bit lines connected to the memory cells. Each memory cell in the present embodiment is an SRAM cell including six MOSFETs. Details of a configuration of the memory cell (s) are described below.

The potential generation circuit 3 generates a process-dependent potential VSINT, which is a potential to be applied to the memory cells in the cell array 1. While the process-dependent potential VSINT increases from a ground potential VSS when an enable signal EN changes to low level (referring to FIGS. 5A and 5B), the rate of increase of the process-dependent potential VSINT is highly dependent on the manufacturing process used for the SRAM. Hereinafter, the process-dependent potential VSINT is referred to simply as a "potential VSINT".

The detection circuit 4 detects the potential VSINT, and outputs a pulse width control signal based on the detected potential VSINT. The pulse width control signal is used for the timing control circuit 2 to control the pulse width of a pulse voltage applied on the word lines (hereinafter referred to as a "WL pulse width"). The detection circuit 4 sets the value of the pulse width control signal to low level when the potential VSINT is lower than a reference potential Vref, and sets the value of the pulse width control signal to high level when the potential VSINT is higher than the reference potential Vref (referring to FIGS. 5A and 5B). The reference potential Vref is an example of a predetermined potential.

The timing control circuit 2, which is a circuit that generates and modulates internal timing of the semiconductor memory device, operates according to a clock signal CLK. The timing control circuit 2 controls the amplitude of a voltage applied on the bit lines (i.e., the BL amplitude) occurring during generation of the pulse voltage by adjusting the WL pulse width based on the value of the pulse width control signal. More specifically, when the value of the pulse width control signal changes to high level within a period in which the voltage on the word lines is at high level, the timing control circuit 2 switches the voltage on the word lines to low level (referring to FIGS. 5A and 5B). With this, the WL pulse width becomes shorter than the pulse width obtained at the normal time. As a result, the BL amplitude decreases (referring to FIGS. 5A and 5B).

Figure 2:
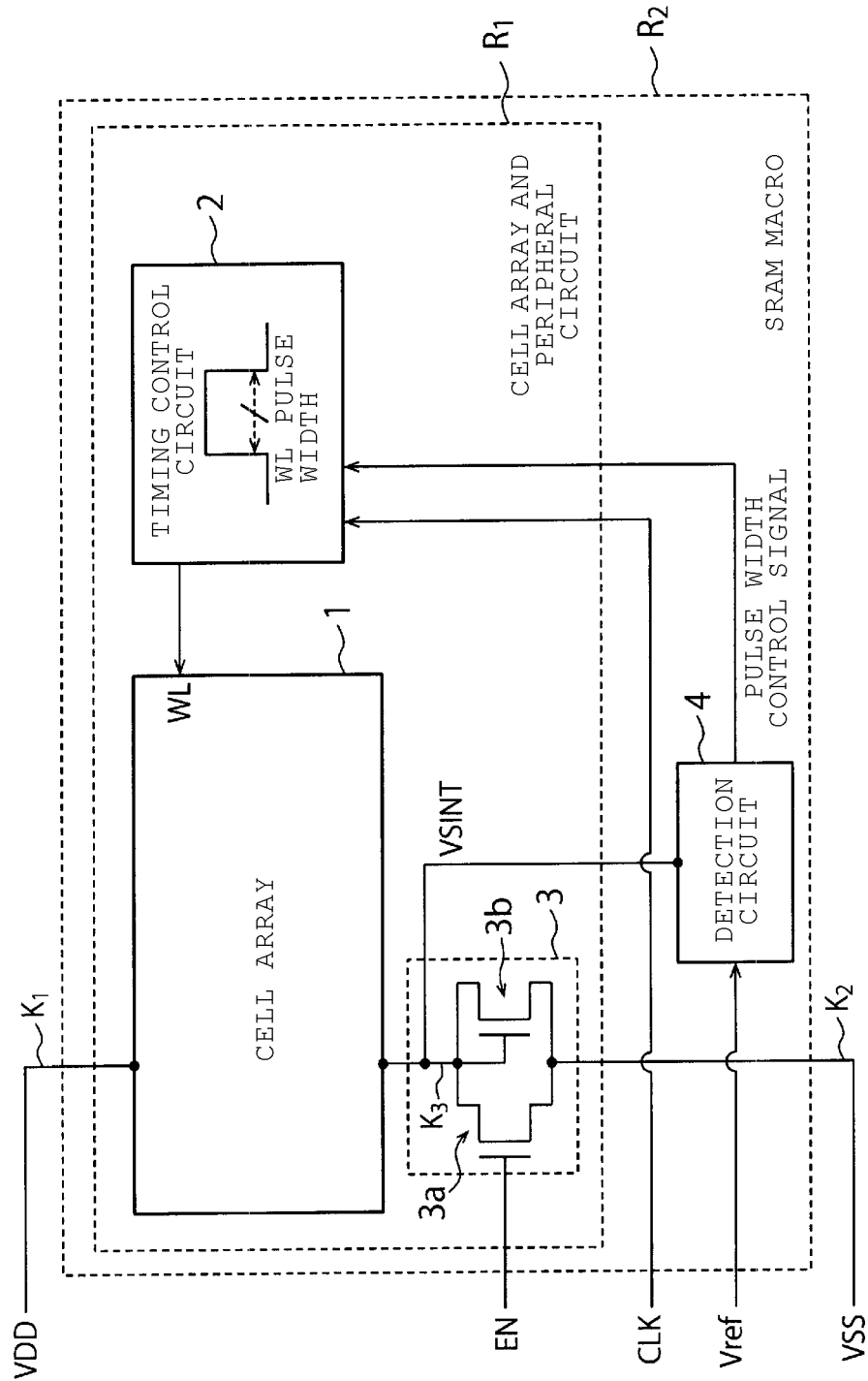
FIG. 2 is a schematic diagram illustrating the configuration of the semiconductor memory device according to the first embodiment more in detail.

FIG. 2 is a schematic diagram illustrating the configuration of the semiconductor memory device according to the first embodiment more in detail.

As illustrated in FIG. 2, the cell array 1 is arranged between a power-supply line (VDD line) $K_1$ and a ground line (VSS line) $K_2$. Moreover, the potential generation circuit 3 is arranged between the cell array 1 and the ground line $K_2$. The cell array 1 and the potential generation circuit 3 are connected by a line $K_3$.

The potential generation circuit 3 in the present embodiment includes a switch 3a and a diode 3b which are connected in parallel between the ground line $K_2$ and the line $K_3$ (from cell array 1). Each of the switch 3a and the diode 3b includes a MOSFET. The source terminals and drain terminals of the switch 3a and the diode 3b are connected to the ground line $K_2$ or the line $K_3$. An enable signal EN is supplied to the gate terminal of the switch 3a. The gate terminal of the diode 3b (diode-connected MOSFET) is connected to the line $K_3$.

The potential VSINT, which is generated by the potential generation circuit 3, is the potential on the line $K_3$, and is applied to the cell array 1 via the line $K_3$. The detection circuit 4, which is connected to the line $K_3$, detects the potential VSINT on the line $K_3$. The potential generation circuit 3 in the present embodiment, which includes the switch 3a and the diode 3b, generates a potential VSINT that is based on the cell current of the cell array 1.

In the present embodiment, when the enable signal EN becomes at low level, the switch 3a is turned off. Then, the potential VSINT becomes a floating potential due to the action of the switch 3a and the diode 3b. As a result, the potential VSINT increases from the ground potential VSS. The potential generation circuit 3 may be configured with other than the switch 3a and the diode 3b as long as the circuit 3 can similarly provide a floating potential as the potential VSINT.

Figure 3:
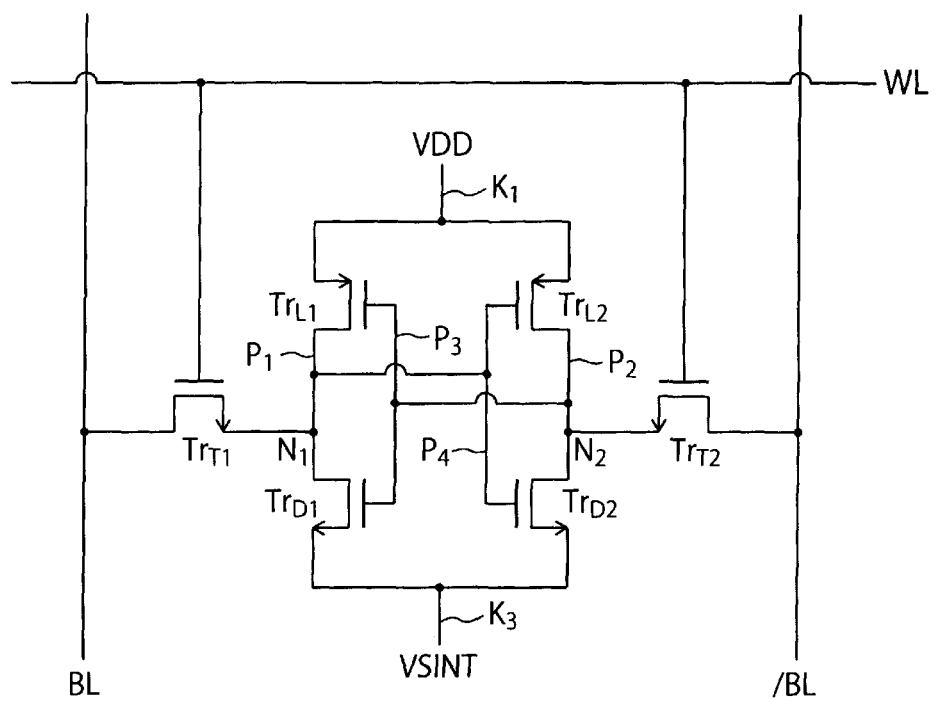
FIG. 3 is a circuit diagram illustrating a configuration of each memory cell according to the first embodiment.

FIG. 3 is a circuit diagram illustrating a configuration of each memory cell (SRAM cell) in the first embodiment.

Each memory cell in the present embodiment includes first and second load transistors $Tr_{L1}$ and $Tr_{L2}$ of pMOS type, first and second driver transistors $Tr_{D1}$ and $Tr_{D2}$ of nMOS type, and first and second transfer transistors $Tr_{T1}$ and $Tr_{T2}$ of nMOS type. FIG. 3 further illustrates a word line WL, bit lines BL and /BL, and storage nodes $N_1$ and $N_2$.

The first load transistor $Tr_{L1}$ and the first driver transistor $Tr_{D1}$ are connected in series by a line $P_1$ between the power-supply line $K_1$ and the line $K_3$. Moreover, the gate terminals of the first load transistor $Tr_{L1}$ and the first driver transistor $Tr_{D1}$ are connected by a line $P_3$. Accordingly, the two transistors $Tr_{L1}$ and $Tr_{D1}$ form an inverter.

Similarly, the second load transistor $Tr_{L2}$ and the second driver transistor $Tr_{D2}$ are connected in series by a line $P_2$ between the power-supply line $K_1$ and the line $K_3$. Moreover, the gate terminals of the second load transistor $Tr_{L2}$ and the second driver transistor $Tr_{D2}$ are connected by a line $P_4$. Accordingly, the two transistors $Tr_{L2}$ and $Tr_{D2}$ form an inverter.

Here, note that, while the source terminals of the first and second load transistors $Tr_{L1}$ and $Tr_{L2}$ are connected to the power-supply line $K_1$, the source terminals of the first and second driver transistors $Tr_{D1}$ and $Tr_{D2}$ are connected not to the ground line $K_2$ but to the line $K_3$. In the present embodiment, the potential generation circuit 3 is interposed between each memory cell and the ground line $K_2$.

The drain terminals of the first load transistor $Tr_{L1}$ and the first driver transistor $Tr_{D1}$ are connected to the gate terminals of the second load transistor $Tr_{L2}$ and the second driver transistor $Tr_{D2}$. Similarly, the drain terminals of the second load transistor $Tr_{L2}$ and the second driver transistor $Tr_{D2}$ are connected to the gate terminals of the first load transistor $Tr_{L1}$ and the first driver transistor $Tr_{D1}$. Accordingly, the four transistors $Tr_{L1}$, $Tr_{L2}$, $Tr_{D1}$, and $Tr_{D2}$ form a flip-flop circuit.

The first transfer transistor $Tr_{T1}$ is used to electrically connect the storage node $N_1$ (on the line $P_1$) and the bit line BL to each other. The source terminal, the drain terminal, and the gate terminal of the first transfer transistor $Tr_{T1}$ are connected to the storage node $N_1$, the bit line BL, and the word line WL, respectively.

The second transfer transistor $Tr_{T2}$ is used to electrically connect the storage node $N_2$ (on the line $P_2$) and the bit line/BL to each other. The source terminal, the drain terminal, and the gate terminal of the second transfer transistor $Tr_{T2}$ are connected to the storage node $N_2$, the bit line/BL, and the word line WL, respectively.

Figure 4A:
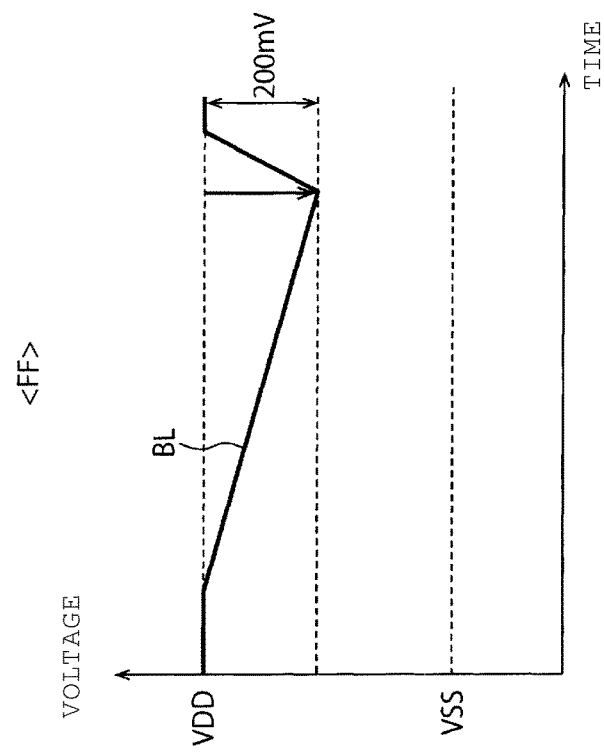
FIGS. 4A and 4B are waveform charts illustrating BL amplitudes according to the first embodiment.
Figure 4B:
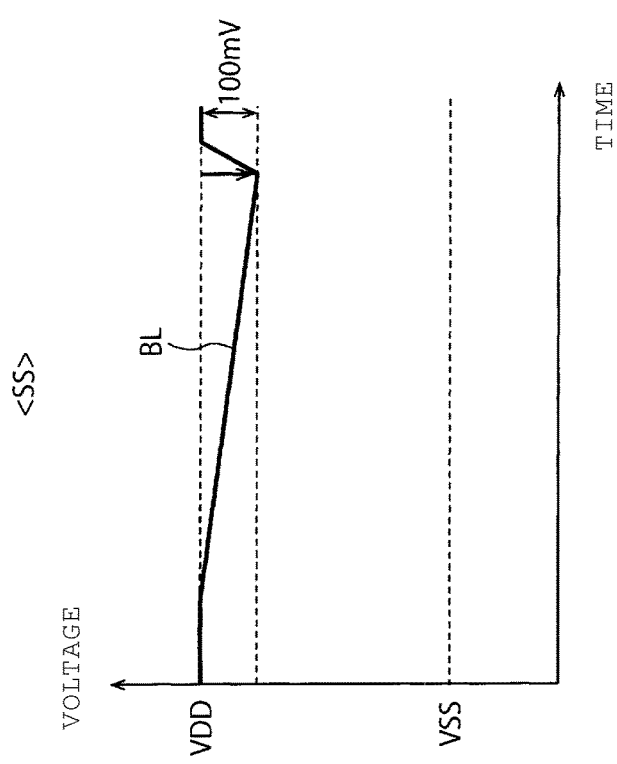

FIGS. 4A and 4B are waveform charts illustrating the BL amplitude in the first embodiment.

FIG. 4A illustrates an example of a voltage on the bit line in the case of the SS operating process. In the case of the SS process, a driving current for the MOSFET is decreased, so that the BL amplitude (the amplitude of a voltage on the bit line BL) becomes less. FIG. 4A illustrates an example in which the BL amplitude is 100 mV, which corresponds to the worst condition in the present embodiment.

FIG. 4B illustrates an example of a voltage on the bit line in the case of the FF operating process. In the case of the FF process, a driving current for the MOSFET is larger, so that the BL amplitude is larger. FIG. 4B illustrates an example in which the BL amplitude is 200 mV, which corresponds to the best condition in the present embodiment.

In the present embodiment, the BL amplitude is selected so that the cells on the bit lines function even when the BL amplitude is in the worst condition (illustrated in FIG. 4A).

In other words, the SRAM in the present embodiment is designed so as to operate in a case where the BL amplitude is equal to or greater than 100 mV. However, when the BL amplitude is in the best condition (illustrated in FIG. 4B), the power consumption of the SRAM would become excessive. Therefore, in the present embodiment, the BL amplitude in the case of the FF process is decreased by adjusting the WL pulse width according to the potential VSINT.

Figures 5A, 5B:
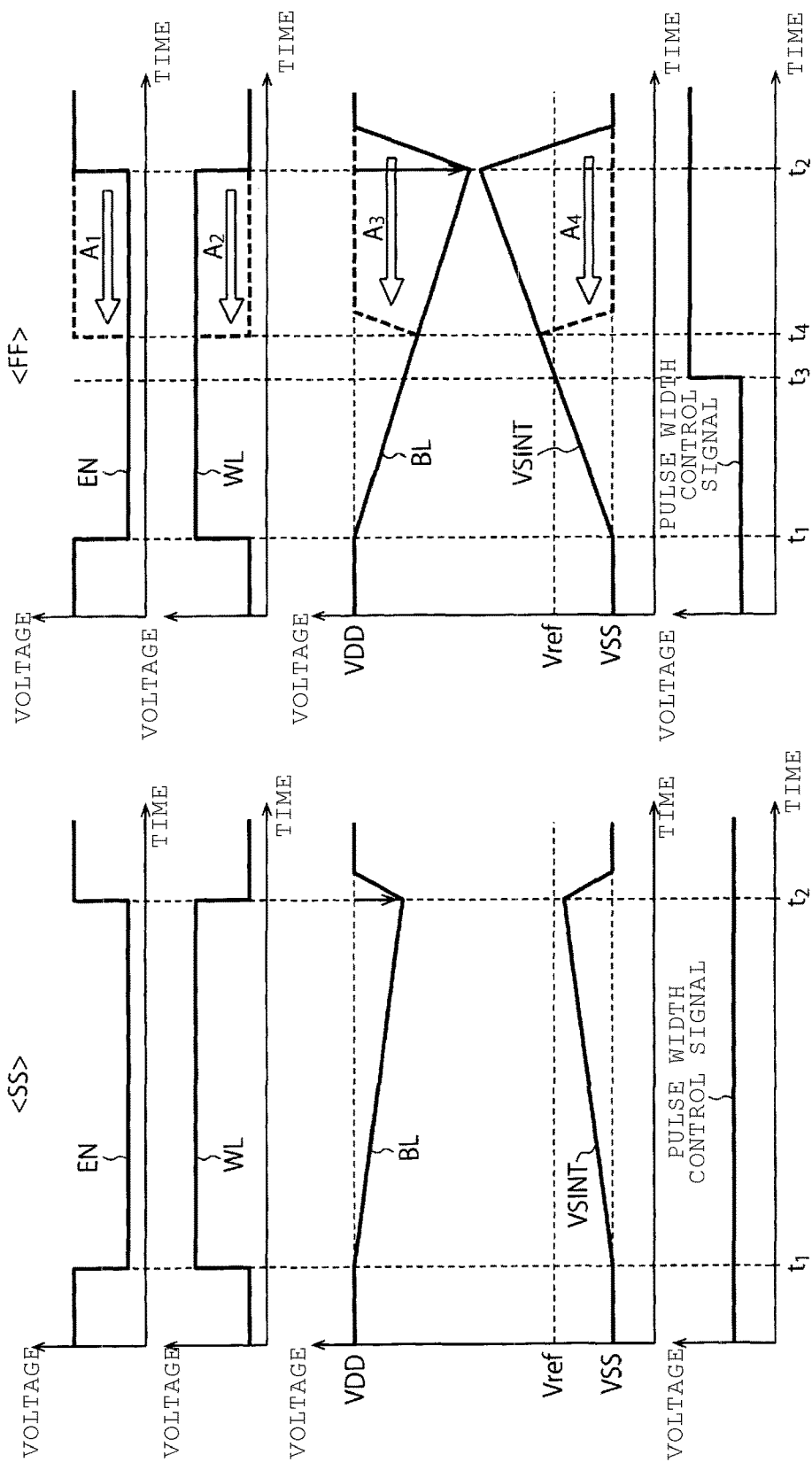
FIGS. 5A and 5B are waveform charts illustrating operations of the semiconductor memory device according to the first embodiment.

FIGS. 5A and 5B are waveform charts illustrating operations of the semiconductor memory device of the first embodiment.

FIG. 5A illustrates changes with time of various voltages in the case of the SS process. FIG. 5B illustrates changes with time of various voltages in the case of the FF process. More specifically, FIGS. 5A and 5B illustrate the enable signal EN, the voltage on the word line WL, the voltage on the bit line BL, the power-supply potential VDD, the ground potential VSS, the reference potential Vref, the process-dependent potential VSINT, and the pulse width control signal. The reference voltage Vref in the present embodiment is set to a value between the power-supply potential VDD and the ground potential VSS.

First, the case of the SS process illustrated in FIG. 5A is described.

When, at a time $t_1$, the enable signal EN changes from high level to low level and the voltage on the word line WL changes from low level to high level, the voltage on the bit line BL begins to decrease from the power-supply potential VDD and the potential VSINT begins to increase from the ground potential VSS. The rate of decrease and rate of increase are highly dependent on the manufacturing process of the SRAM. In the case of the SS process, the voltage on the bit line BL moderately (relatively slowly) decreases with time, and the potential VSINT moderately (relatively slowly) increases.

In a case where the pulse width of the enable signal EN is the width obtained at the normal operating times, the enable signal EN changes from low level to high level at a time $t_2$. This also applies for the pulse width of a pulse voltage (labeled "WL") on the word line WL (the WL pulse width). On the other hand, when the potential VSINT reaches the reference potential Vref within a period in which the enable signal EN is at low level, the detection circuit 4 varies the value of the pulse width control signal to change the WL pulse width. In other words, when the potential VSINT reaches the reference potential Vref inside a time period from the time $t_1$ to the time $t_2$, the value of the pulse width control signal varies. However, in the case illustrated in FIG. 5A, since the potential VSINT does not reach the reference potential Vref before the time $t_2$, the value of the pulse width control signal remains at low level over the entire time period from $t_1$ to $t_2$.

Next, the case of the FF process illustrated in FIG. 5B is described.

When, at the time $t_1$, the enable signal EN changes from high level to low level and the voltage on the word line WL changes from low level to high level, the voltage on the bit line BL begins to decrease from the power-supply potential VDD and the potential VSINT begins to increase from the ground potential VSS. In the case of the FF process, the voltage on the bit line BL rapidly (relatively quickly) decreases, and the potential VSINT rapidly (relatively quickly) increases.

In a case where the pulse width of the enable signal EN is the width obtained at the normal operating time, the enable signal EN will change from low level to high level at the time $t_2$. This also applies to the pulse width of a pulse voltage on the word line WL (the WL pulse width). On the other hand, if the potential VSINT reaches the reference potential Vref within a while the enable signal EN is still at the low level, the detection circuit 4 varies the value of the pulse width control signal to change the WL pulse width. In the case illustrated in FIG. 5B, since the potential VSINT reaches the reference potential Vref at a time $t_3$ (between $t_1$ and $t_2$), the value of the pulse width control signal is switched from low level to high level at the time $t_3$.

When the value of the pulse width control signal is changed from low level to high level at the time $t_3$, the enable signal EN is then switched from low level to high level at a time $t_4$. This is a decrease (arrow $A_1$) of the normal pulse width of the enable signal EN. The difference between the time $t_3$ and the time $t_4$ corresponds to a delay time of signal transfer from the detection circuit 4 to another circuit.

In this case, the timing control circuit 2 adjusts the BL amplitude by adjusting the WL pulse width based on the value of the pulse width control signal. More specifically, when the value of the pulse width control signal is changed from low level to high level at the time $t_3$, the timing control circuit 2 switches the voltage on the word line WL from high level to low level at the time $t_4$ (arrow $A_2$). This makes the WL pulse width be shorter than the width obtained at the normal time. As a result, the maximum achieved BL amplitude decreases (arrow $A_3$). The voltage on the bit line BL shifts to increase at the time $t_4$ and then returns to the power-supply potential VDD. On the other hand, since the enable signal EN changes to high level at the time $t_4$ and the floating state of the potential VSINT ceases at the time $t_4$, the potential VSINT shifts to decrease at the time $t_4$ and then returns to the ground potential VSS (arrow $A_4$).

In a case where the BL amplitude in the worst condition is 100 mV and the BL amplitude in the best condition is 200 mV, the reference potential Vref is set, for example, higher than the ground potential VSS by about 100 mV. In this case, the period from the time $t_1$ to the time $t_4$ would be approximately half of the period from the time $t_1$ to the time $t_2$. As a result, the power consumption caused by the bit lines BL in the case of the FF process can be reduced to about the half, so that the power consumption in the case of the FF process can be brought closer to the power consumption in the case of the SS process.

In this way, according to the present embodiment, decreasing the BL amplitude for the FF process reduces the power consumption of the SRAM associated with the BL amplitude.

Figure 6:
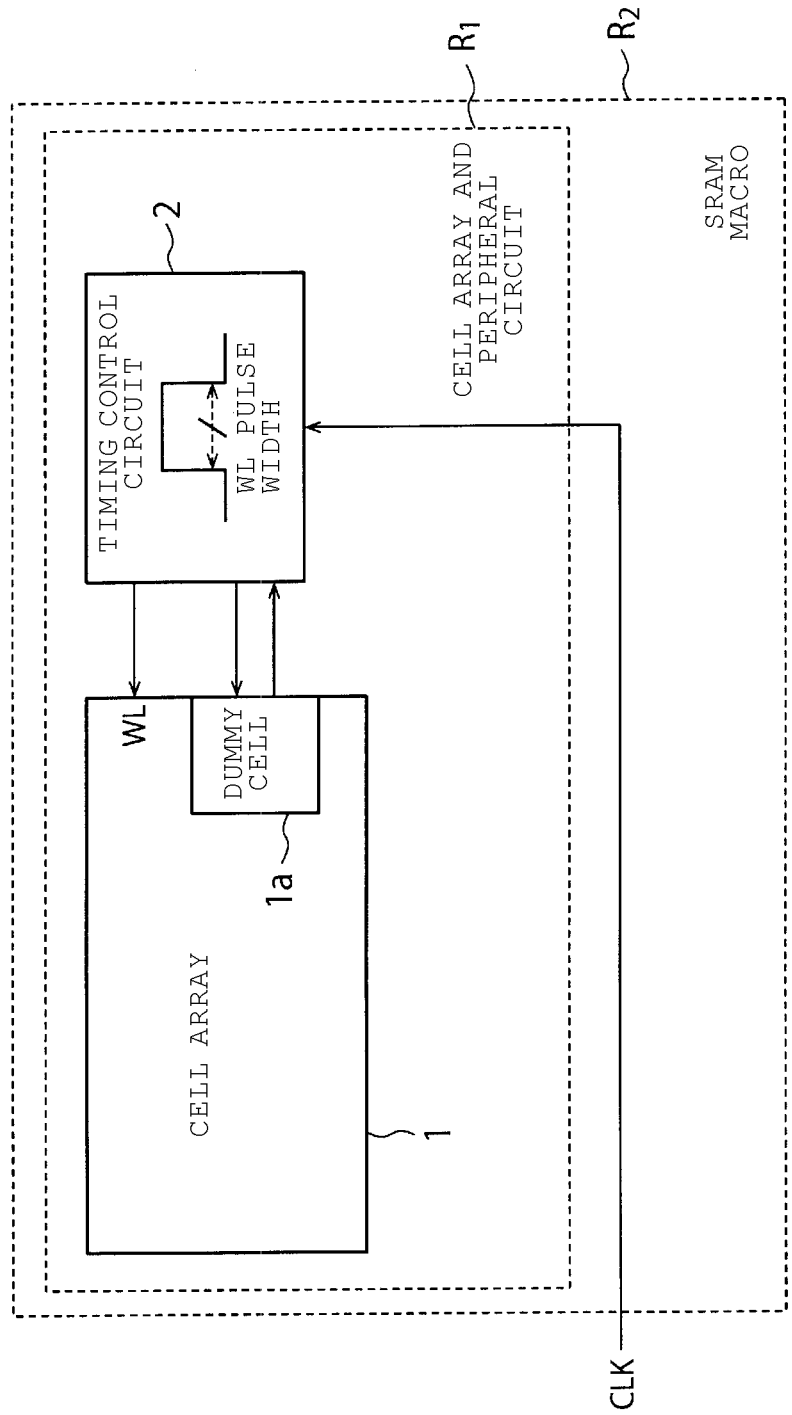
FIG. 6 is a schematic diagram illustrating a configuration of a semiconductor memory device according to a comparative example for the first embodiment.

FIG. 6 is a schematic diagram illustrating a configuration of a semiconductor memory device according to a comparative example of the first embodiment.

The semiconductor memory device according to the comparative example does not include the potential generation circuit 3 and the detection circuit 4, but instead includes a dummy cell 1a inside the cell array 1. In this case, the power supply separation between the cell array 1 and the peripheral circuit is achieved by the dummy cell 1a at the time of a standby state of the SRAM, so that the standby power consumption of the SRAM can be reduced.

However, the comparative example cannot deal with a difference in power consumption between the SS process and the FF process. Therefore, the power consumption in the case of the FF process would become needlessly large. On the other hand, the first embodiment can deal with this issue by adjusting the BL amplitude applied for the FF process.

As described above, the semiconductor memory device according to the first embodiment controls the BL amplitude by adjusting the WL pulse width based on the process-dependent potential VSINT. Therefore, according to the first embodiment, an increase in the power consumption of the semiconductor memory device can be reduced.

Second Embodiment

Figure 7:
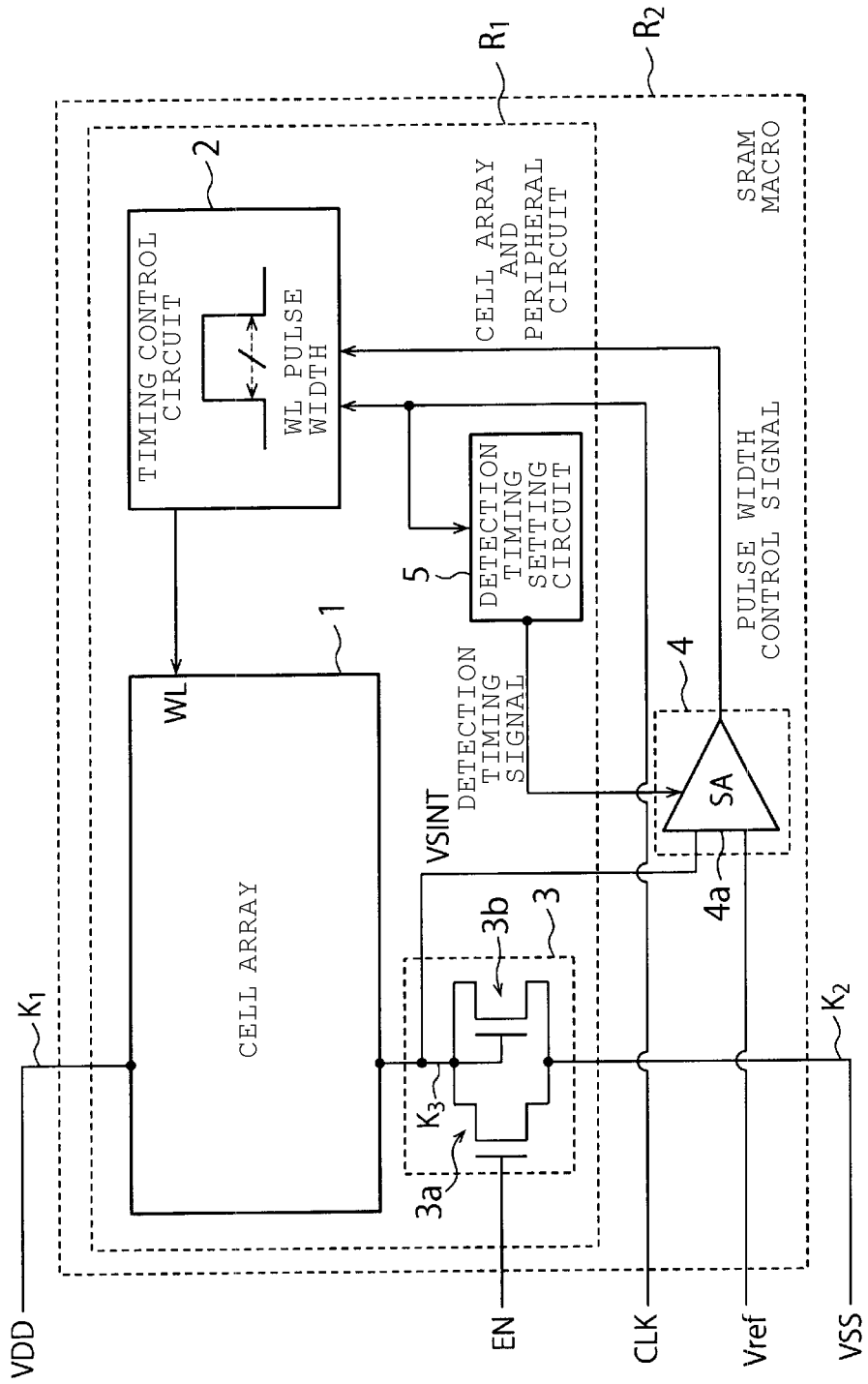
FIG. 7 is a schematic diagram illustrating a configuration of a semiconductor memory device according to a second embodiment.

FIG. 7 is a schematic diagram illustrating a configuration of a semiconductor memory device according to a second embodiment.

The semiconductor memory device illustrated in FIG. 7 includes a detection timing setting circuit 5 in addition to the elements illustrated in FIG. 2. Moreover, the detection circuit 4 illustrated in FIG. 7 includes a sense amplifier (SA) 4a, which includes a first input terminal to which the potential VSINT is input, a second input terminal to which the reference potential Vref is input, and an output terminal from which the pulse width control signal is output.

The detection timing setting circuit 5 sets the timing at which the SA 4a detects the potential VSINT, and operates according to the clock signal CLK. The detection timing setting circuit 5 outputs a detection timing signal to the SA 4a.

The SA 4a detects the potential VSINT at the timing supplied by the detection timing setting circuit 5. More specifically, the SA 4a does not detect the potential VSINT when the detection timing signal is at low level, and detects the potential VSINT when the detection timing signal is at high level (refer to FIGS. 8A and 8B). When the potential VSINT is higher than the reference potential Vref when the detection timing signal is at high level, the SA 4a changes the WL pulse width by changing the value of the pulse width control signal.

FIGS. 8A and 8B are waveform charts illustrating operations of the semiconductor memory device according to the second embodiment.

The operation in the case of the SS process illustrated in FIG. 8A is similar to that illustrated in FIG. 5A. However, the SA 4a operates only during a period in which the detection timing signal is at high level. The detection timing signal in the second embodiment rises after the time $t_1$, and falls before the time $t_2$. This enables limiting the operation period of the SA 4a to a part of the period in which the enable signal EN is at low level or the period in which the voltage on the word line WL is at high level.

Next, the case of the FF process illustrated in FIG. 8B is described.

When, at the time $t_1$, the enable signal EN changes from high level to low level and the voltage on the word line WL changes from low level to high level, the voltage on the bit line BL begins to decrease from the power-supply potential VDD and the potential VSINT begins to increase from the ground potential VSS.

The detection timing setting circuit 5 switches the detection timing signal from low level to high level after the time $t_1$. In a case where the potential VSINT is higher than the reference potential Vref within a period in which the detection timing signal is at high level, the SA 4a changes the WL pulse width by changing the value of the pulse width control signal. In the case illustrated in FIG. 8B, since the potential VSINT reaches the reference potential Vref at the time $t_3$ within this period, the value of the pulse width control signal is switched from low level to high level at the time $t_3$.

When the value of the pulse width control signal is changed from low level to high level at the time $t_3$, the enable signal EN is then switched from low level to high level at the time $t_4$. In this case, the timing control circuit 2 controls the BL amplitude by adjusting the WL pulse width (change denoted by arrow $A_1$) based on the value of the pulse width control signal. More specifically, when the value of the pulse width control signal is changed from low level to high level at the time $t_3$, the timing control circuit 2 switches the voltage on the word line WL from high level to low level at the time $t_4$ (arrow $A_2$). This makes the WL pulse width shorter than the width at the normal operation time. As a result, the BL amplitude decreases (arrow $A_3$). The voltage on the bit line BL shifts to increase at the time $t_4$ and then returns to the power-supply potential VDD. On the other hand, the potential VSINT shifts to decrease at the time $t_4$ and then returns to the ground potential VSS (arrow $A_4$).

As described above, the semiconductor memory device according to the second embodiment limits the timing at which the detection circuit 4 (the SA 4a) detects the potential VSINT to the timing set by the detection timing setting circuit 5. Therefore, according to the second embodiment, causing the detection circuit 4 to operate only at that timing enables reducing the power consumption of the detection circuit 4, and this enables further reducing power consumption of the semiconductor memory device.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
   a cell array comprising memory cells;
   a potential generation circuit configured to apply a first potential to the memory cells;
   a control signal output circuit configured to output a control signal based on the first potential; and
   a pulse width adjustment circuit configured to adjust a pulse width of a word line voltage applied to word lines of the cell array, the pulse width being adjusted by the pulse width adjustment circuit based on the control signal, wherein
   an amplitude of a voltage on bit lines connected to the memory cells of the cell array is controlled with the pulse width of the word line voltage,
   the cell array is connected between a power supply line and a ground line, and
   the potential generation circuit is connected between the cell array and the ground line.

2. The semiconductor memory device according to claim 1, wherein the potential generation circuit comprises a diode and a switch connected in parallel between the cell array and a ground potential node.

3. The semiconductor memory device according to claim 1, wherein the first potential floats between a power source potential and a ground potential.

4. The semiconductor memory device according to claim 1, wherein a value of the control signal is changed when the first potential reaches a predetermined potential.

5. The semiconductor memory device according claim 1, further comprising:
   a detection timing setting circuit configured to control a timing at which the control signal output circuit detects the first potential.

6. The semiconductor memory device according to claim 1, wherein the potential generation circuit comprises a pair of transistors connected in parallel with each other between the cell array and a ground potential node, a gate of a first transistor of the pair being connected to an enable signal line and a second transistor of the pair being a diode-connected transistor.

7. The semiconductor memory device according to claim 6, wherein the pair of transistors comprise metal-oxide-semiconductor field-effect transistors.

8. The semiconductor memory device according to claim 1, wherein the control signal output circuit comprises a sense amplifier circuit.

9. The semiconductor memory device according to claim 1, wherein the memory cells comprise static random access memory (SRAM) cells.

10. A semiconductor memory device, comprising:
a cell array comprising static random access memory (SRAM) cells connected between a power source potential line and a first potential line;
a potential generation circuit comprising a switch and a diode connected in parallel between the first potential line and a ground potential line;
a control signal output circuit configured to output a control signal based on a potential of the first potential line; and
a pulse width adjustment circuit configured to adjust a pulse width of a word line voltage applied to a word line of the cell array, the pulse width being adjusted based on the control signal, wherein
an amplitude of a voltage on bit lines of the cell array changes in accordance with the pulse width of the word line voltage.

11. The semiconductor memory device according to claim 10, wherein the switch comprises a transistor and the diode comprises a diode-connected transistor.

12. The semiconductor memory device according to claim 10, wherein the control signal output circuit compares the potential of the first potential line to a predetermined potential that is between the ground potential and the power source potential.

13. The semiconductor memory device according to claim 12, further comprising:
a detection timing setting circuit configured to control a timing at which the control signal output circuit compares the potential of the first potential line to the predetermined potential.

14. The semiconductor memory device according to claim 13, wherein the control signal output circuit is configured to detect the first potential at the timing set by the detection timing setting circuit.

15. The semiconductor memory device according to claim 14, wherein the control signal output circuit comprises a sense amplifier.

16. A semiconductor memory device, comprising:
a plurality of static random access memory (SRAM) cells, each SRAM cell comprising a pair of inverters connected between a power supply line and a first potential line;
a potential generation circuit comprising:
a first transistor having a first terminal connected to the first potential line, a second terminal connected to a ground potential line, and a gate terminal connected to an enable signal line,
a second transistor having a first terminal connected to the first potential line, a second terminal connected to the ground potential line, and a gate terminal connected to the first potential line;
a control signal output circuit connected to the first potential line and configured to output a control signal at a first level when a potential of the first potential line is greater than or equal to a reference potential and at a second level when the potential of the first potential line is less than the reference potential;
a pulse width adjustment circuit configured to adjust a pulse width of a word line voltage of the plurality of SRAM cells, wherein
an amplitude of a voltage on bit lines connected to the plurality of SRAM cells changes in accordance with the pulse width of the word line voltage.

17. The semiconductor memory device according claim 16, further comprising:
a detection timing setting circuit configured to control a timing at which the control signal output circuit detects the potential of the first potential line.

18. The semiconductor memory device according to claim 16, wherein the control signal output circuit comprises a sense amplifier.

19. The semiconductor memory device according to claim 16, wherein a potential of the word line is changed from a high level to a low level by the pulse width adjustment circuit when the control signal changes from the second level to the first level.

* * * * *